United States Patent
Song et al.

(10) Patent No.: US 7,852,132 B2
(45) Date of Patent: Dec. 14, 2010

(54) SEMICONDUCTOR INTEGRATED CIRCUIT

(75) Inventors: Hee Woong Song, Ichon (KR); Yong Ju Kim, Ichon (KR); Sung Woo Han, Ichon (KR); Ic Su Oh, Ichon (KR); Hyung Soo Kim, Ichon (KR); Tae Jin Hwang, Ichon (KR); Hae Rang Choi, Ichon (KR); Ji Wang Lee, Ichon (KR); Jae Min Jang, Ichon (KR); Chang Kun Park, Ichon (KR)

(73) Assignee: Hynix Semiconductor Inc. (KR)

( * ) Notice: Subject to any disclaimer, the term of this patent is extended or adjusted under 35 U.S.C. 154(b) by 0 days.

(21) Appl. No.: 12/340,912

(22) Filed: Dec. 22, 2008

(65) Prior Publication Data

US 2010/0060332 A1    Mar. 11, 2010

(30) Foreign Application Priority Data

Sep. 11, 2008    (KR) .................... 10-2008-0089555

(51) Int. Cl.
*H03L 7/06* (2006.01)
(52) U.S. Cl. ...................... 327/156; 327/147
(58) Field of Classification Search .......... 327/147, 327/156
See application file for complete search history.

(56) References Cited

U.S. PATENT DOCUMENTS

| 6,181,213 | B1 | 1/2001 | Chang | |
|---|---|---|---|---|
| 7,368,961 | B2 * | 5/2008 | Werner et al. | 327/156 |
| 7,449,927 | B2 * | 11/2008 | Kim | 327/156 |
| 2002/0141280 | A1 | 10/2002 | Hamamoto et al. | |
| 2007/0285180 | A1 * | 12/2007 | Wu | 331/57 |
| 2007/0291828 | A1 * | 12/2007 | Martin et al. | 375/219 |
| 2009/0167386 | A1 * | 7/2009 | Song | 327/157 |

FOREIGN PATENT DOCUMENTS

| JP | 2004056717 | 2/2004 |
|---|---|---|
| KR | 1019950007435 | 10/1995 |
| KR | 1020010035839 | 5/2001 |
| KR | 1020030080534 | 10/2003 |

* cited by examiner

*Primary Examiner*—Lincoln Donovan
*Assistant Examiner*—Adam D Houston
(74) *Attorney, Agent, or Firm*—Baker & McKenzie LLP

(57) ABSTRACT

A semiconductor integrated circuit comprises a PLL (Phase Locked Loop (PLL) circuit configured to generate a control voltage in response to a frequency of a reference clock signal, and to generate a PLL clock signal having a frequency that corresponds to a level of the control voltage, and a voltage controlled oscillator configured to oscillate an output clock signal in response to the PLL clock signal, and to allow the PLL clock signal to have a frequency that corresponds to a level of the control voltage.

13 Claims, 3 Drawing Sheets

SEMICONDUCTOR INTEGRATED CIRCUIT

CROSS-REFERENCES TO RELATED APPLICATION

The present application claims the benefit under 35 U.S.C. 119(a) to Korean Application No. 10-2008-0089555, filed on Sep. 11, 2008, in the Korean Intellectual Property Office, which is incorporated herein by reference in its entirety as if set forth in full.

BACKGROUND

1. Technical Field

The embodiments described herein relate to a semiconductor integrated circuit (IC), and more particularly, to a clock control apparatus of a semiconductor IC.

2. Related Art

In general, a semiconductor IC includes a clock generating circuit, such as a Delay Locked Loop (DLL) circuit and a Phase Locked Loop (PLL) circuit, to generate an internal clock signal having a phase faster than an external clock signal by a predetermined time. Accordingly, the internal clock signal generated in this way is used to synchronize timing for buffering data during data input/output operations.

Since a frequency of the internal clock signal determines an operational speed of a semiconductor IC, a clock generating circuit is provided to generate an internal clock signal having a higher frequency in order to improve the operational speed. Accordingly, semiconductor ICs include a method for oscillating a clock signal having a relatively high frequency by using the PLL circuit. In addition, the semiconductor ICs include a method of dividing a clock signal into a plurality of individual frequencies by using a mufti-phase DLL circuit.

Currently, semiconductor ICs use a PLL circuit for oscillating a PLL clock signal by using a reference clock signal input through a clock signal input buffer, and then transmitting the buffered clock signal input to a data input/output circuit along a relatively long conductive transmission line to generate an internal clock signal by using a DLL circuit. Here, the DLL circuit is implemented as a multi-phase DLL circuit, and the internal clock signal is implemented as a set of clock signals each having multiple phases. However, using both a PLL circuit and a DLL circuit in one semiconductor IC degrades internal area efficiency of a semiconductor IC, thereby preventing high integration of the semiconductor IC. In addition, since both the PLL and DLL circuits are provided together, consumption power greatly increases. Thus, the semiconductor IC fails to maintain a low power consumption, thereby reducing power efficiency of the semiconductor IC.

SUMMARY

A semiconductor IC capable of improving area efficiency and power efficiency is described herein.

In one aspect, a semiconductor integrated circuit comprises a PLL (Phase Locked Loop (PLL)) circuit configured to generate a control voltage in response to a frequency of a reference clock signal, and to generate a PLL clock signal having a frequency that corresponds to a level of the control voltage, and a voltage controlled oscillator configured to oscillate an output clock signal in response to the PLL clock signal, and to allow the PLL clock signal to have a frequency that corresponds to a level of the control voltage.

In another aspect, a semiconductor integrated circuit comprises a Phase Locked Loop (PLL) circuit configured to generate a PLL clock signal in response to a frequency of a reference clock signal, a voltage controlled oscillator configured to oscillate an output clock signal in response to the PLL clock signal, and a transmission line configured to transmit the PLL clock signal from the PLL circuit to the voltage controlled oscillator, the transmission line comprising a length that is larger than a sum of a pathway of the reference clock signal from the clock input buffer to the PLL circuit and a transmission length of the output clock signal from the voltage controlled oscillator to the plurality of data input/output buffers.

In another aspect, a semiconductor integrated circuit comprises a clock input buffer configured to buffer an external clock signal and to generate a reference clock signal, a clock generating circuit configured to generate an internal clock signal in response to a frequency of the reference clock signal, a voltage controlled oscillator configured to oscillate and output a plurality of output clock signals having multiple phases in response to the internal clock signal, and a plurality of data input/output buffers configured to receive the plurality of output clock signals to perform buffering operations on input/output data.

These and other features, aspects, and embodiments are described in detailed below in the section "Detailed Description."

BRIEF DESCRIPTION OF THE DRAWINGS

Features, aspects, and embodiments are described in conjunction with the attached drawings, in which.

DETAILED DESCRIPTION

Figure 1:
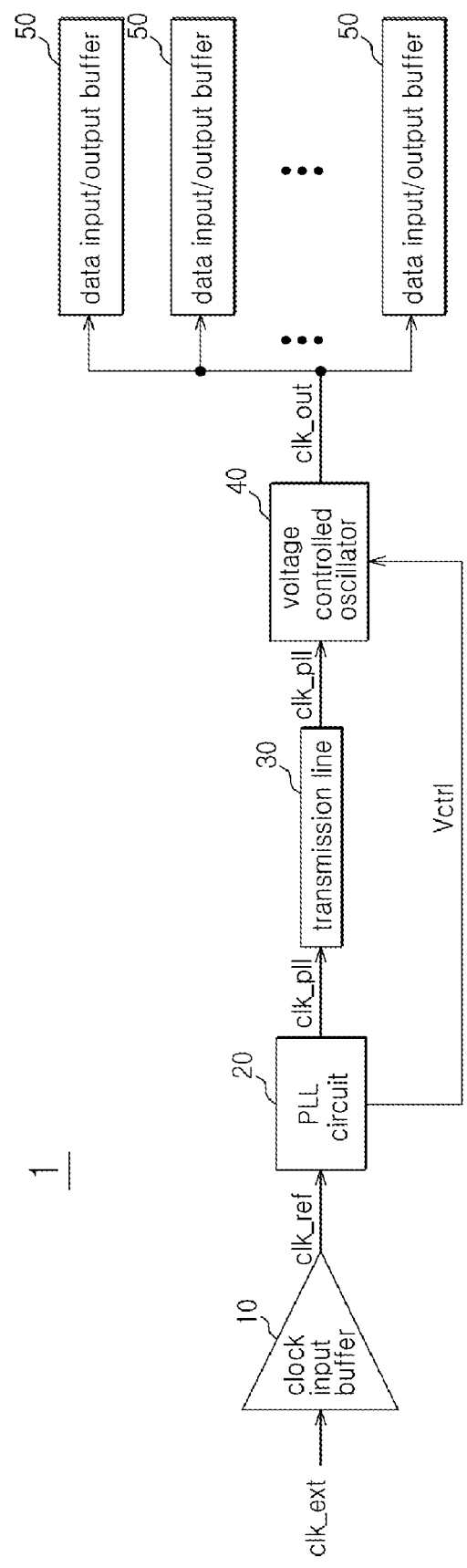
FIG. 1 is a schematic block diagram of an exemplary semiconductor IC according to one embodiment.

FIG. 1 is a schematic block diagram of an exemplary semiconductor IC 1 according to one embodiment. In FIG. 1, the semiconductor IC 1 can be configured to include a clock input buffer 10, a PLL circuit 20, a transmission line 30, a voltage controlled oscillator 40, and a plurality of data input/output buffers 50. Although not specifically shown, the semiconductor IC 1 can be implemented on a substrate as individual components or integrated as a single circuit configuration on and/or in a substrate.

The clock input buffer 10 can buffer an external clock signal 'clk_ext' to generate a reference clock signal 'clk_ref'. The PLL circuit 20 can generate a PLL clock signal 'clk_pll' in response to a frequency of the reference clock signal 'clk_ref'. The transmission line 30 can transmit the PLL clock signal 'clk_pll'. The voltage controlled oscillator 40 can oscillate an output clock signal 'clk_out' in response to the PLL clock signal 'clk_pll' transmitted along the transmission line 30. The plurality of data input/output buffers 50 can receive the output clock signal 'clk_out' and perform buffering operations on input/output data.

For example, the PLL circuit 20 can generate a control voltage Vctrl in response to a frequency of the reference clock signal 'clk_ref'. In addition, the PLL circuit 20 can generate the PLL clock signal 'clk_pll' having a frequency that corresponds to a level of the control voltage Vctrl. In addition, the control voltage Vctrl can be provided to the voltage controlled oscillator 40, and the voltage controlled oscillator 40 can match a frequency of the output clock signal 'clk_out' with the level of the control voltage Vctrl. Accordingly, both the output clock signal 'clk_out' and the PLL clock signal 'clk_pll' can have substantially the same frequency.

In FIG. 1, the output clock signal 'clk_out' can be implemented as a plurality of clock signals, each having different multiple phases. For example, the output clock signal 'clk_out' can be a combination of a plurality of clock signals generated by dividing a phase of the PLL clock signal 'clk_pll'. Accordingly, the plurality of clock signals can be respectively transmitted to the data input/output buffers 50, which can be allocated in advance.

In FIG. 1, although not drawn to specific scale, a length of the transmission line 30 can be larger than a sum of the transmission length of the reference clock signal 'clk_ref' from the clock input buffer 10 to the PLL circuit 20. Moreover, a length of the transmission line 30 can be larger than a pathway of the output clock signal 'clk_out' from the voltage controlled oscillator 40 to the data input/output buffers 50. For example, the PLL circuit 20 is located near the clock input buffer 10, which receives the external clock signal 'clk_ext', and the voltage controlled oscillator 40, which is located near the data input/output buffers 50. The voltage controlled oscillator 40 can be used, e.g., instead of a DLL circuit as in conventional circuits, to overcome any adverse noise effects by a semiconductor IC due to the clock signals, which have multiple phases, being transmitted along a relatively long transmission line 30. Here, the voltage controlled oscillator 40 functions in response to the PLL clock signal 'clk_pll' to generate the output clock signals 'clk_out', each having multiple phases, which can have substantially the same frequency with the PLL clock signal 'clk_pll'. Accordingly, the voltage controlled oscillator 40 can contribute to reducing occupational area of the semiconductor IC and reduce consumption current.

Figure 2:
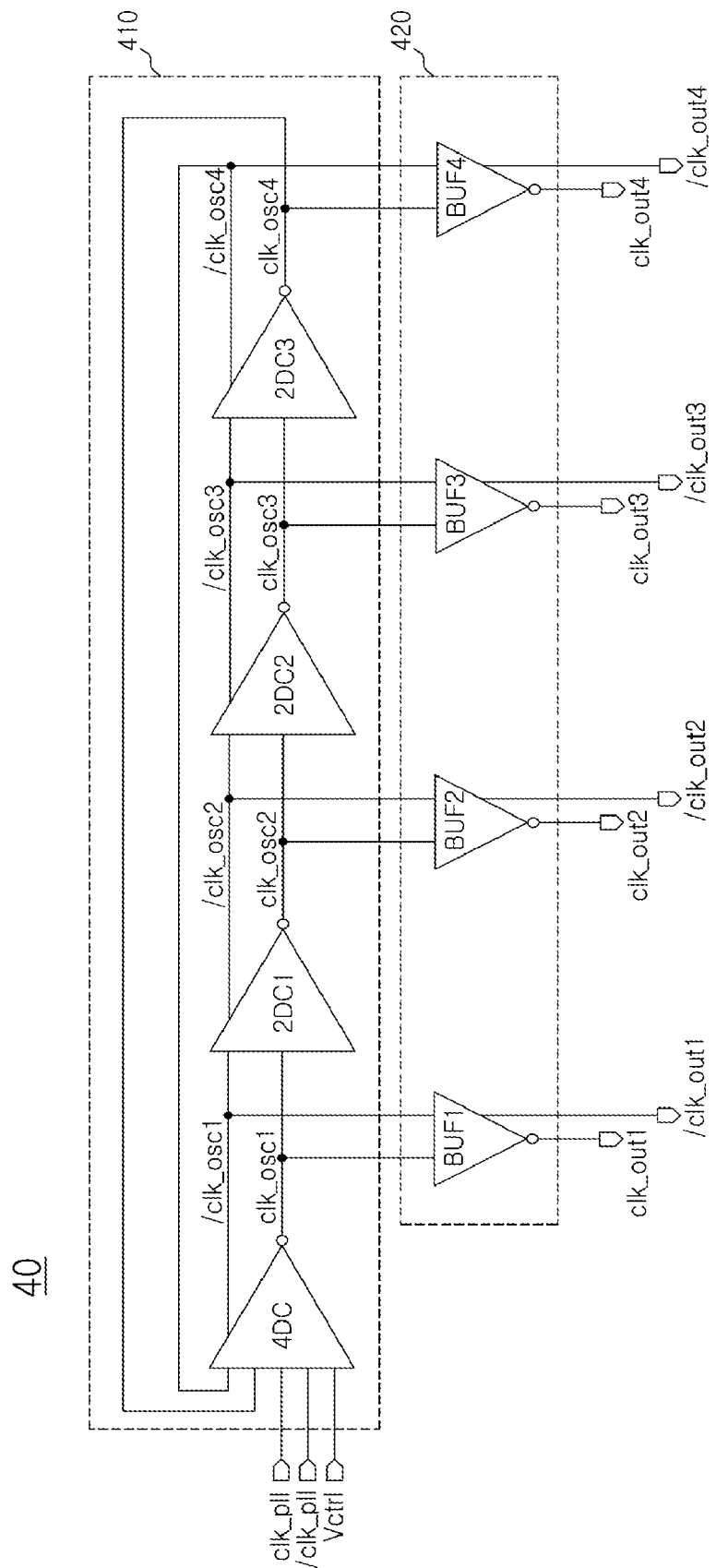
FIG. 2 is a schematic circuit diagram of an exemplary voltage controlled oscillator capable of being implemented in the semiconductor IC of FIG. 1 according to one embodiment.

FIG. 2 is a schematic circuit diagram of an exemplary voltage controlled oscillator 40 capable of being implemented in the semiconductor IC 1 of FIG. 1 according to one embodiment. In FIG. 2, the voltage controlled oscillator 40 can receive the PLL clock signal 'clk_pll', as clock signal pairs, and can produce the output clock signals 'clk_out', as clock pairs having four phases, for example. Alternatively, the output clock signals 'clk_out' can be clock pairs having more or less than four phases.

For example, as shown in FIG. 2, the voltage controlled oscillator 40 can include an oscillation unit 410 and a buffering unit 420. The oscillation unit 410 can generate oscillation clock signal pair 'clk_osc<1:4>' and '/clk_osc<1:4>' in response to the PLL clock signal pair 'clk_pll' and '/clk_pll' and the control voltage Vctrl. For example, the oscillation unit 410 can include a 4-input delay cell 4DC and first to third 2-input delay cells 2DC1 to 2DC3. Alternatively, the oscillation unit 410 can include more or less than a 4-input delay cell and more or less than 2-input delay cells.

The 4-input delay cell 4DC can buffer the PLL clock signal pair 'clk_pll' and '/clk_pll' and a fourth oscillation clock signal pair 'clk_osc4' and '/clk_osc4' in response to the control voltage Vctrl to generate a first oscillation clock signal pair 'clk_osc1' and '/clk_osc1'. In addition, the first 2-input delay cell 2DC1 can buffer the first oscillation clock signal pair 'clk_osc1' and '/clk_osc1' to generate a second oscillation clock signal pair 'clk_osc2' and '/clk_osc2'. Similarly, the second 2-input delay cell 2DC2 can buffer the second oscillation clock signal pair 'clk_osc2' and '/clk_osc2' to generate a third oscillation clock signal pair 'clk_osc3' and '/clk_osc3'. Likewise, the third 2-input delay cell 2DC3 can buffer the third oscillation clock signal pair 'clk_osc3' and '/clk_osc3' to generate a fourth oscillation clock signal pair 'clk_osc4' and '/clk_osc4'. Accordingly, if n-input delay cells are used, wherein "n" can be greater than one, then corresponding oscillation clock signal pairs can be buffered to generate corresponding ones of oscillation clock signal pairs.

In FIG. 2, the buffering unit 420 can buffer the four oscillation clock signal pairs 'clk_osc<1:4>' and '/clk_osc<1:4>' to output the output clock signal pairs 'clk_out' and '/clk_out' having four phases, respectively. For example, the buffering unit 420 can include first to fourth clock buffers BUF1 to BUF4. Alternatively, the buffering unit 420 can include more or less than four clock buffers.

The first clock buffer BUF1 can buffer the first oscillation clock signal pair 'clk_osc1' and '/clk_osc1' to output a first output clock signal pair 'clk_out1' and '/clk_out1'. Similarly, the second clock buffer BUF2 can buffer the second oscillation clock signal pair 'clk_osc2' and '/clk_osc2' to output a second output clock signal pair 'clk_out2' and '/clk_out2'. The third clock buffer BUF3 can buffer the third oscillation clock signal pair 'clk_osc3' and '/clk_osc3' to output a third output clock signal pair 'clk_out3' and '/clk_out3'. The fourth clock buffer BUF4 can buffer the fourth oscillation clock signal pair 'clk_osc4' and '/clk_osc4' to output a fourth output clock signal pair 'clk_out4' and '/clk_out4'.

In FIG. 2, the voltage controlled oscillator 40 can generate the output clock signal pairs 'clk_out<1:4>' and '/clk_out<1:4>' having phases that correspond to the PLL clock signal pair 'clk_pll' and '/clk_pll'. For example, the 4-input delay cell 4DC of the oscillation unit 410 can receive the control voltage Vctrl as an input to generate the first oscillation clock signal pair 'clk_osc1' and '/clk_osc1' having a frequency that corresponds to its voltage level. Accordingly, the output clock signal pairs 'clk_out<1:4>' and '/clk_out<1:4>' can be configured to have substantially the same frequency with the PLL clock signal pair 'clk_pll' and '/clk_pll'. In addition, both the first to third 2-input delay cells 2DC1 to 2DC3 of the oscillation unit 410 and the first to fourth clock buffers BUF1 to BUF4 of the buffering unit 420 can have oscillator structures.

Figure 3:
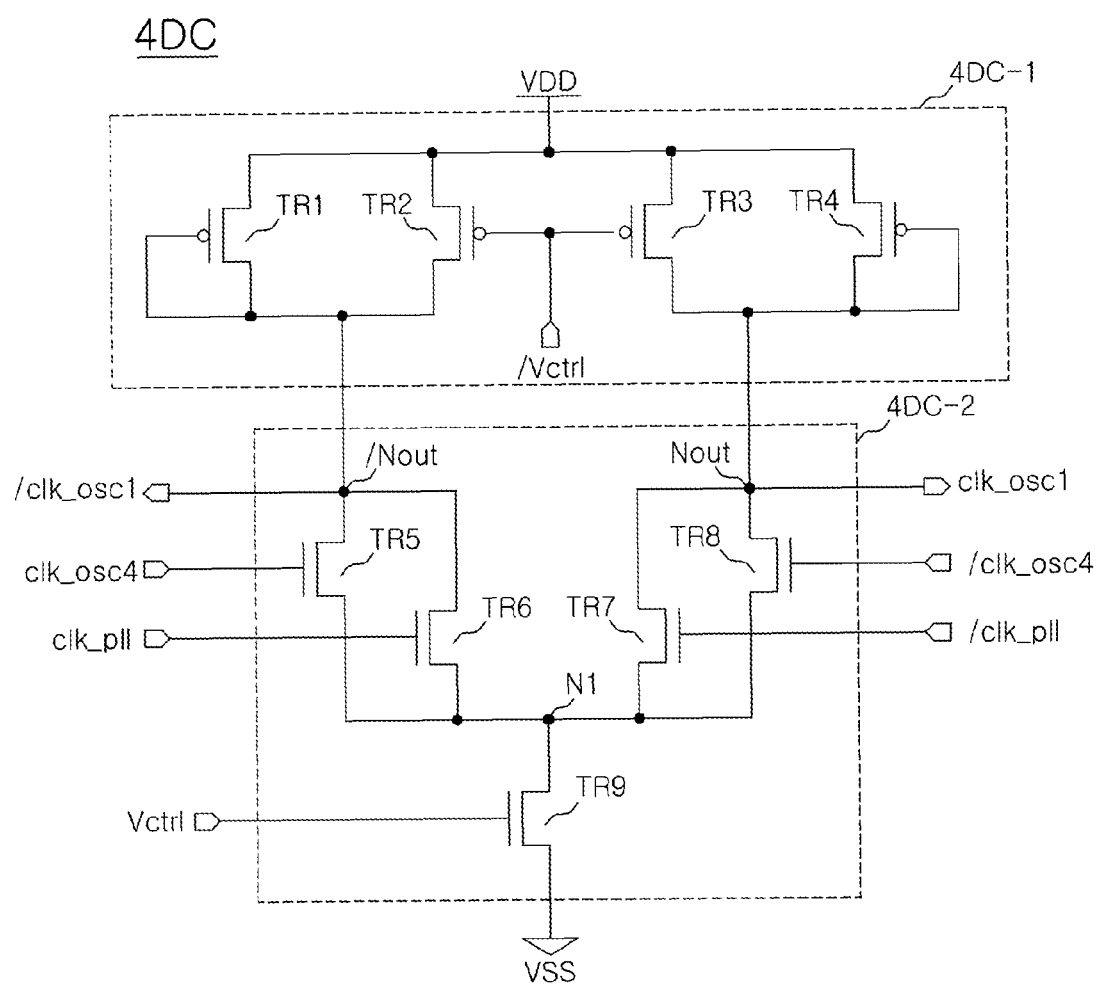
FIG. 3 is a schematic circuit diagram of an exemplary 4-input delay cell capable of being implemented in the oscillator of FIG. 2 according to one embodiment.

FIG. 3 is a schematic circuit diagram of an exemplary 4-input delay cell 4DC capable of being implemented in the oscillator 40 of FIG. 2 according to one embodiment. In FIG. 3, the 4-input delay cell 4DC can receive the control voltage Vctrl as a positive control voltage Vctrl and a negative control voltage /Vctrl.

For example, the 4-input delay cell 4DC can be configured to include a positive output node (Nout), a negative output node (/Nout), a pull-up unit 4DC-1, and a pull-down unit 4DC-2. The positive output node (Nout) can output the first positive oscillation clock signal 'clk_osc1', and the negative output node (/Nout) can output the first negative oscillation clock signal '/clk_osc1'. In addition, the pull-up unit 4DC-1 can pull-up the output node pair (Nout) and (/Nout) in response to the negative control voltage /Vctrl. For example, the pull-up unit 4DC-1 can include first to fourth transistors TR1 to TR4.

In FIG. 3, the first transistor TR1 can have a gate terminal and a drain terminal commonly connected to the negative output node (/Nout), and a source terminal to which an external supply voltage VDD can be supplied. The second transistor TR2 can have a gate terminal to which the negative control voltage/Vctrl can be supplied, a source terminal to which the external supply voltage VDD can be supplied, and a drain terminal connected to the negative output node (/Nout). The third transistor TR3 can have a gate terminal to which the negative control voltage/Vctrl can be supplied, a source terminal to which the external supply voltage VDD can be supplied, and a drain terminal connected to the positive output node (Nout). The fourth transistor TR4 can have a gate terminal and a drain terminal commonly connected to the positive output node (Nout), and a source terminal to which the external supply voltage VDD can be supplied.

The pull-down unit 4DC-2 can pull-down the output node pair (Nout) and (/Nout) in response to the PLL clock signal pair 'clk_pll' and 'clk_pll', the fourth oscillation clock signal pair 'clk_osc4' and '/clk_osc4', and the positive control voltage Vctrl. For example, the pull-down unit 4DC-2 includes fifth to ninth transistors TR5 to TR9.

The fifth transistor TR5 can have a gate terminal to which the fourth positive oscillation clock signal 'clk_osc4' can be input, a drain terminal connected to the negative output node (/Nout), and a source terminal connected to a first node (N1). The sixth transistor TR6 can have a gate terminal to which the positive PLL clock signal 'clk_pll' can be input, a drain terminal connected to the negative output node (/Nout), and a source terminal connected to the first node (N1). The seventh transistor TR7 can have a gate terminal to which the negative PLL clock signal '/clk_pll' can be input, a drain terminal connected to the positive output node (Nout), and a source terminal connected to the first node (N1). The eighth transistor TR8 can have a gate terminal to which the fourth negative oscillation clock signal '/clk_osc4' can be input, a drain terminal connected to the positive output node (Nout), and a source terminal connected to the first node (N1). The ninth transistor TR9 can have a gate terminal to which the positive control voltage Vctrl can be input, a drain terminal connected to the first node (N1), and a source terminal connected to a ground VSS.

Accordingly, the 4-input delay cell 4DC can generate the first oscillation clock signal pair 'clk_osc1' and '/clk_osc1' having a frequency that corresponds to levels of the positive control voltage Vctrl and the negative control voltage/Vctrl. For example, a level of the positive control voltage Vctrl can be higher than a level of the negative control voltage/Vctrl. Moreover, the larger a level difference between the positive control voltage Vctrl and the negative control voltage /Vctrl is, the higher the frequency of the first oscillation clock signal pair 'clk_osc1' and '/clk_osc1' can be. In addition, the pull-down unit 4DC-2 can function such that the sixth transistor TR6 and the seventh transistor TR7 can have stronger driving powers than the fifth transistor TR5 and the eighth transistor TR8. Thus, phases of the first oscillation clock signal pair 'clk_osc1' and '/clk_osc1' can be relatively close to the phases of the PLL clock signal pair 'clk_pll' and '/clk_pll'.

As described above, a semiconductor IC can include a voltage controlled oscillator for providing output clock signals having multiple phases, which can be located near the plurality of data input/output buffers. In addition, the voltage controlled oscillator can control a frequency of output clock signals having multiple phases, which can be output from the voltage controlled oscillator, by using control voltage generated in a PLL circuit. Accordingly, the voltage controlled oscillator can provide clock signals having the same frequency with a PLL clock to the plurality of data input/output buffers. Thus, by using the voltage controlled oscillator instead of a DLL circuit, which is substantially smaller than a DLL circuit, area efficiency of a semiconductor IC can be improved. Moreover, since the voltage controlled oscillator consumes less power than a DLL circuit, power efficiency of a semiconductor IC can also be improved.

While certain embodiments have been described above, it will be understood that the embodiments described are by way of example only. Accordingly, the device and methods described herein should not be limited based on the described embodiments. Rather, the device and methods described herein should only be limited in light of the claims that follow when taken in conjunction with the above description and accompanying drawings.

What is claimed is:

1. A semiconductor integrated circuit, comprising:
   a Phase Locked Loop (PLL) circuit configured to generate a control voltage in response to a frequency of a reference clock signal, and to generate a PLL clock signal having a frequency that corresponds to a level of the control voltage; and
   a voltage controlled oscillator configured to receive the PLL clock signal and the control voltage, to oscillate an output clock signal in response to the PLL clock signal, and to allow the PLL clock signal to have a frequency that corresponds to a level of the control voltage.

2. The semiconductor integrated circuit of claim 1, further comprising a transmission line configured to transmit the PLL clock signal.

3. The semiconductor integrated circuit of claim 1, further comprising a plurality of data input/output buffers, each configured to receive the output clock signal to perform buffering operations on input/output data.

4. The semiconductor integrated circuit of claim 3, wherein the output clock signal is implemented as a plurality of clock signals having multiple phases.

5. The semiconductor integrated circuit of claim 4, wherein the plurality of clock signals have respective ones of the multiple phases configured to be transmitted to different ones of the plurality of data input/output buffers.

6. The semiconductor integrated circuit of claim 5, wherein the voltage controlled oscillator includes an oscillation unit configured to generate a plurality of oscillation clock signals in response to the PLL clock signal and the control voltage.

7. The semiconductor integrated circuit of claim 6, wherein the voltage controlled oscillator further includes a buffering unit configured to respectively buffer the plurality of oscillation clock signals to produce the output clock signals, each having the multiple phases.

8. The semiconductor integrated circuit of claim 2, further comprising a clock input buffer configured to buffer an external clock signal to generate the reference clock signal.

9. The semiconductor integrated circuit of claim 8, wherein the clock input buffer is configured such that a length of the transmission line is larger than a sum of a pathway of the reference clock signal from the clock input buffer to the PLL circuit and a transmission length of the output clock signal from the voltage controlled oscillator to the plurality of data input/output buffers.

10. A semiconductor integrated circuit, comprising:
    a clock input buffer configured to buffer an external clock signal to generate a reference clock signal;
    a Phase Locked Loop (PLL) circuit configured to receive the reference clock signal and to generate a control voltage and a PLL clock signal using a frequency of the reference clock signal;
    a voltage controlled oscillator configured to receive the control voltage and the PLL clock signal and to oscillate an output clock signal in response to the PLL clock signal;
    a transmission line configured to be connected between the PLL circuit and the voltage controlled oscillator so as to transmit the PLL clock signal from the PLL circuit to the voltage controlled oscillator, the transmission line comprising a length that is larger than a sum of a pathway of the reference clock signal from the clock input buffer to the PLL circuit and a transmission length of the output clock signal from the voltage controlled oscillator to the plurality of data input/output buffers; and a plurality of data input/output buffers configured to receive the output clock signal to perform buffering operations on input/output data, wherein a first distance between the clock buffer and the PLL circuit is shorter than a second distance between the PLL circuit and the voltage controlled oscillator, and each of third distances between the voltage controlled oscillator and the plurality of data input/output buffers is shorter than a fourth distance between the voltage controlled oscillator and the PLL circuit.

11. The semiconductor integrated circuit of claim 10, wherein the output clock signal is implemented as a plurality of clock signals, each having multiple phases configured to be transmitted to different ones of the plurality of data input/output buffers.

12. The semiconductor integrated circuit of claim 11, wherein the voltage controlled oscillator is configured to receive the control voltage generated by the PLL circuit to control a frequency of the PLL clock signal, and to control a frequency of the output clock signal in response to the control voltage.

13. The semiconductor integrated circuit of claim 12, wherein the voltage controlled oscillator includes:

an oscillation unit configured to generate a plurality of oscillation clock signals in response to the PLL clock signal and the control voltage; and a buffering unit configured to respectively buffer the plurality of oscillation clock signals to produce the plurality of output clock signals having the multiple phases.

* * * * *